United States Patent
Li

(10) Patent No.: US 11,402,954 B2
(45) Date of Patent: Aug. 2, 2022

(54) FLEXIBLE TOUCH CONTROL DISPLAY MODULE

(71) Applicant: WUHAN CHINA STAR OPTOELECTRONICS SEMICONDUCTOR DISPLAY TECHNOLOGY CO., LTD., Wuhan (CN)

(72) Inventor: Bo Li, Wuhan (CN)

( * ) Notice: Subject to any disclaimer, the term of this patent is extended or adjusted under 35 U.S.C. 154(b) by 365 days.

(21) Appl. No.: 16/325,405

(22) PCT Filed: Jan. 14, 2019

(86) PCT No.: PCT/CN2019/071598
§ 371 (c)(1),
(2) Date: Feb. 14, 2019

(87) PCT Pub. No.: WO2020/113779
PCT Pub. Date: Jun. 11, 2020

(65) Prior Publication Data
US 2021/0173517 A1      Jun. 10, 2021

(30) Foreign Application Priority Data
Dec. 7, 2018   (CN) .......................... 201811491580.3

(51) Int. Cl.
*G06F 3/044*       (2006.01)
*H01L 27/32*       (2006.01)
(Continued)

(52) U.S. Cl.
CPC .......... *G06F 3/0443* (2019.05); *H01L 27/323* (2013.01); *H01L 27/3244* (2013.01);
(Continued)

(58) Field of Classification Search
CPC ...... G06F 3/0412; G06F 3/044; G06F 3/0446; G06F 3/0416; G06F 3/04164;
(Continued)

(56) References Cited

U.S. PATENT DOCUMENTS 6,849,922 B2 * 2/2005 Park ................... H01L 51/5256
                                                               257/633
10,153,333 B1   12/2018 Li
(Continued)

FOREIGN PATENT DOCUMENTS

CN       106952941 A       7/2017
CN       107369385 A       11/2017
(Continued)

*Primary Examiner* — Olga V Merkoulova

(57) ABSTRACT

A flexible touch control display module includes an array substrate, an organic light emitting diode (OLED) light emitting layer, a thin film encapsulation layer, a touch control layer, and a polarizing film layer. The polarizing film layer includes an adhesive layer, a photo alignment layer, and a protective layer. The photo alignment layer is disposed on the touch control layer, and the adhesive layer is disposed between the touch control layer and the photo alignment layer, such that the photo alignment layer is adhered to the touch control layer, and the protective layer is disposed on the photo alignment layer.

9 Claims, 1 Drawing Sheet

(51) Int. Cl.
*H01L 51/00* (2006.01)
*H01L 51/52* (2006.01)

(52) U.S. Cl.
CPC ...... *H01L 51/0097* (2013.01); *H01L 51/5253* (2013.01); *H01L 51/5281* (2013.01); *G06F 2203/04102* (2013.01); *H01L 2251/5338* (2013.01)

(58) Field of Classification Search
CPC ......... G06F 3/0443; G06F 2203/04103; G06F 2203/04111; G06F 3/0445
See application file for complete search history.

(56) References Cited

U.S. PATENT DOCUMENTS

| | | | | |
|---|---|---|---|---|
| 11,101,332 B2* | 8/2021 | Zeng | ..................... | G06F 3/0443 |
| 11,258,021 B2* | 2/2022 | Li | ....................... | H01L 51/0097 |
| 2004/0041147 A1* | 3/2004 | Park | ..................... | H01L 51/5256 |
| | | | | 257/40 |
| 2007/0105043 A1* | 5/2007 | Elian | ........................ | G03F 7/40 |
| | | | | 430/270.1 |
| 2010/0134448 A1* | 6/2010 | Park | ..................... | G02F 1/13338 |
| | | | | 349/119 |
| 2010/0252857 A1* | 10/2010 | Nakatani | ............ | H01L 51/0029 |
| | | | | 257/100 |
| 2011/0267714 A1* | 11/2011 | Makino | ................ | C07D 495/04 |
| | | | | 359/892 |
| 2013/0335344 A1* | 12/2013 | Han | ........................ | G06F 3/047 |
| | | | | 345/173 |
| 2014/0265822 A1* | 9/2014 | Drzaic | ................ | H01L 51/5284 |
| | | | | 313/504 |
| 2015/0144909 A1* | 5/2015 | Byun | .................. | H01L 51/5253 |
| | | | | 257/40 |
| 2015/0169094 A1* | 6/2015 | Liu | ....................... | H01L 27/323 |
| | | | | 345/173 |
| 2016/0020259 A1* | 1/2016 | Cheng | .................. | H01L 51/0024 |
| | | | | 257/40 |
| 2016/0137769 A1* | 5/2016 | Kwack | ................ | H01L 51/5256 |
| | | | | 257/40 |
| 2016/0254487 A1* | 9/2016 | Harikrishna Mohan | .................... | |
| | | | | C23C 28/30 |
| | | | | 428/213 |
| 2017/0301736 A1* | 10/2017 | Wang | .................. | H01L 51/5253 |
| 2017/0322358 A1* | 11/2017 | Ueki | ......................... | B32B 7/12 |
| 2017/0336831 A1 | 11/2017 | Zhang et al. | | |
| 2018/0342568 A1 | 11/2018 | Jin et al. | | |
| 2019/0233565 A1* | 8/2019 | Endo | ........................ | C09K 19/3852 |
| 2019/0259968 A1 | 8/2019 | Choi et al. | | |

FOREIGN PATENT DOCUMENTS

| | | |
|---|---|---|
| CN | 107565063 A | 1/2018 |
| CN | 107863447 A | 3/2018 |
| CN | 107871751 A | 4/2018 |
| CN | 107957813 A | 4/2018 |

* cited by examiner

FLEXIBLE TOUCH CONTROL DISPLAY MODULE

FIELD OF INVENTION

The present disclosure relates to the field of display technologies, and more particularly to a flexible touch control display module.

BACKGROUND OF INVENTION

At present, active matrix organic light emitting diode (AMOLED) display technologies are recognized by the market and consumers as compared with thin film transistor liquid crystal display (TFT-LCD) display technologies, which have advantages of low energy consumption, high color contrast, and wide viewing angle. In addition, because the AMOLED display technologies can achieve thin, light, and flexible design, this also brings more innovation space for a whole machine design. At present, AMOLED screens are mainly divided into rigid screens for low and medium-end and flexible screens for high-end. The rigid screens use two pieces of glass, and key components such as a TFT component and an OLED light emitting layer are fabricated on a first glass substrate, and then a packaged glass is attached to an OLED display panel on which all components are fabricated, and a display component is protected. This enhances product reliability. The flexible screens directly use polyimide (PI) as a display panel of an AMOLED display and use a thin film encapsulation (TFE) layer instead of a package glass, this structure can effectively reduce a thickness of a product, and can achieve flexible display, which is a main direction of current technology developments. The touch screen technologies with these two display technologies are external and on-cell touch screen technologies. The external touch screen technologies are to attach a touch screen having a film substrate to a touch control module and an OLED display module through optical adhesive bonding. The technical difficulty and cost are relatively low, a disadvantage thereof is that it will significantly increase the thickness of the product. On-cell technologies are to make a touch control line to the package glass or TFE layer. Compared to the external touch screen technologies, the on-cell technologies have been reduced a thin film substrate, and this can effectively reduce the thickness of the product and reduce the cost, but the technical difficulty is relatively high. In either case, in order to ensure a display performance of the display screen, it is necessary to attach a polarizer above the display module. Current polarizer includes a four-layer film structure, and an overall thickness thereof is thick, which does not conform to a technical trend of thin and light products.

In summary, in current flexible touch control display modules, because the polarizer needs to be attached on the display module, a thickness of the flexible touch control display module is increased, and the production cost of the flexible touch control display module is further increased.

SUMMARY OF INVENTION

The present disclosure provides a flexible touch control display module, which can effectively reduce a thickness of the flexible touch control display module, so as to solve issues of current flexible touch control display modules, wherein a polarizer needs to be attached on a display module, a thickness of the current flexible touch control display module is increased, and the production cost thereof is further increased.

To solve the above technical problem, a technical solution provided by the present disclosure is as follows.

The present disclosure provides a flexible touch control display module including an array substrate, an organic light emitting diode (OLED) light emitting layer, a thin film encapsulation layer, a touch control layer, and a polarizing film layer. The OLED light emitting layer is disposed on a surface of the array substrate. The thin film encapsulation layer is disposed on a surface of the OLED light emitting layer. The touch control layer is disposed on the thin film encapsulation layer. The polarizing film layer is disposed on the touch control layer. The polarizing film layer includes an adhesive layer, a photo alignment layer, and a protective layer. The photo alignment layer is disposed on the touch control layer, and the adhesive layer is disposed between the touch control layer and the photo alignment layer, such that the photo alignment layer is adhered to the touch control layer, and the protective layer is disposed on the photo alignment layer. The adhesive layer is a pressure-sensitive optical adhesive or a photosensitive liquid substrate.

In an embodiment of the present disclosure, a material of the photosensitive liquid substrate includes polyacrylic acid.

In an embodiment of the present disclosure, a material of the photo alignment layer includes polyvinyl alcohol.

In an embodiment of the present disclosure, the protective layer includes an organic photoresist or silicon nitride.

In an embodiment of the present disclosure, the touch control layer is provided with a touch control electrode formed by curing an electrically conductive netlike member.

In an embodiment of the present disclosure, the thin film encapsulation layer includes a first inorganic encapsulation layer, a first organic encapsulation layer, and a second inorganic encapsulation layer disposed in a stack.

In an embodiment of the present disclosure, the touch control layer is disposed on a surface of the second inorganic encapsulation layer.

In an embodiment of the present disclosure, a material of the first inorganic encapsulation layer includes one or a combination of two or more of silicon nitride, silicon dioxide, aluminum oxide, titanium dioxide, and zirconium dioxide.

In an embodiment of the present disclosure, a material of the organic encapsulation layer includes an olefin acid ester polymer, and a material of the second inorganic encapsulation layer and a material of the first inorganic encapsulation layer are same.

The present disclosure further provides a flexible touch control display module including an array substrate, an organic light emitting diode (OLED) light emitting layer, a thin film encapsulation layer, a touch control layer, and a polarizing film layer. The OLED light emitting layer is disposed on a surface of the array substrate. The thin film encapsulation layer is disposed on a surface of the OLED light emitting layer. The touch control layer is disposed on the thin film encapsulation layer. The polarizing film layer is disposed on the touch control layer. The polarizing film layer includes an adhesive layer, a photo alignment layer, and a protective layer. The photo alignment layer is disposed on the touch control layer, and the adhesive layer is disposed between the touch control layer and the photo alignment layer, such that the photo alignment layer is adhered to the touch control layer, and the protective layer is disposed on the photo alignment layer.

In an embodiment of the present disclosure, a material of the photo alignment layer includes polyvinyl alcohol.

In an embodiment of the present disclosure, the protective layer includes an organic photoresist or silicon nitride.

In an embodiment of the present disclosure, the touch control layer is provided with a touch control electrode formed by curing an electrically conductive netlike member.

In an embodiment of the present disclosure, the thin film encapsulation layer includes a first inorganic encapsulation layer, a first organic encapsulation layer, and a second inorganic encapsulation layer disposed in a stack.

In an embodiment of the present disclosure, the touch control layer is disposed on a surface of the second inorganic encapsulation layer.

In an embodiment of the present disclosure, a material of the first inorganic encapsulation layer includes one or a combination of two or more of silicon nitride, silicon dioxide, aluminum oxide, titanium dioxide, and zirconium dioxide.

In an embodiment of the present disclosure, a material of the organic encapsulation layer includes an olefin acid ester polymer, and a material of the second inorganic encapsulation layer and a material of the first inorganic encapsulation layer are same.

The beneficial effects of the embodiment of the present disclosure are that, in the flexible touch control display module of the embodiment of the present disclosure, the touch control layer, the photo alignment layer, and the protective layer are formed on the thin film encapsulation layer of the touch control display module, thereby avoiding an externally attached polarizer and an external type touch screen, this further reduces a number of module fittings, and further reduces an overall thickness of the flexible touch control display module.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
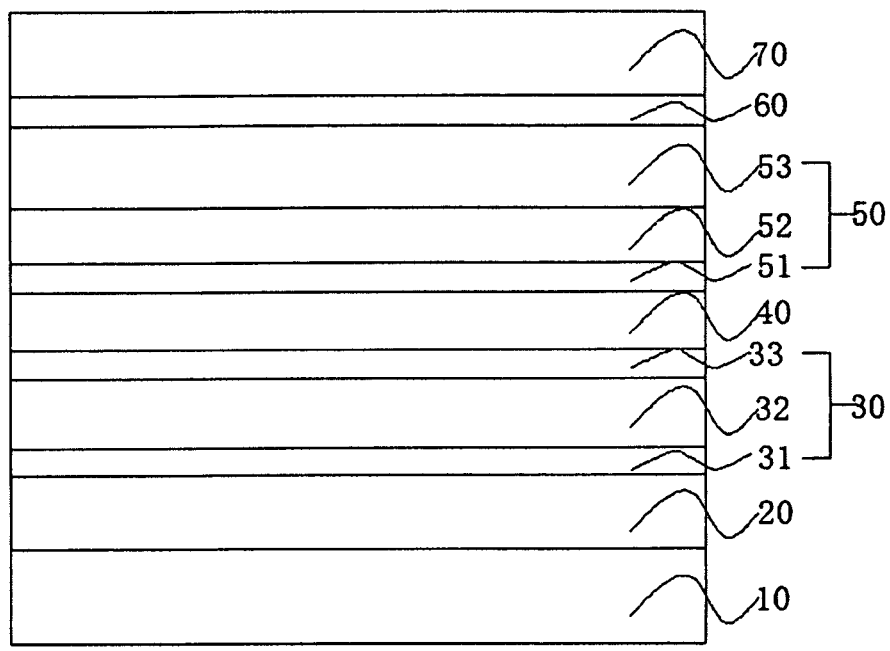
FIG. 1 is a schematic structural diagram of a flexible touch control display module according to a first embodiment of the present disclosure.

The following description of the various embodiments is provided to illustrate the specific embodiments with reference to the accompanying drawings. Directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

In current flexible touch control display modules, because a polarizer needs to be attached on a display module, a thickness of the flexible touch control display module is increased, and the production cost of the flexible touch control display module is further increased, an embodiment of the present disclosure can solve issues of the prior art.

Referring to FIG. 1, a schematic structural diagram of a flexible touch control display module according to a first embodiment of the present disclosure is provided. It is understood that the flexible touch control display module according to the embodiment of the present disclosure can be applied to an electronic device that requires a display screen, such as a notebook computer, a smart phone, and a tablet computer.

Referring to FIG. 1, an embodiment of the present disclosure provides a flexible touch control display module including an array substrate 10, an organic light emitting diode (OLED) light emitting layer 20, a thin film encapsulation layer 30, a touch control layer 40, and a polarizing film layer 50.

The polarizing film layer 50 includes an adhesive layer 51, a photo alignment layer 52, and a protective layer 53. The photo alignment layer 52 is disposed on the touch control layer 40, and the adhesive layer 51 is disposed between the touch control layer 40 and the photo alignment layer 52, such that the photo alignment layer 52 is adhered to the touch control layer 40, and the protective layer 53 is disposed on the photo alignment layer 52.

In details, the array substrate 10 includes a display area and a non-display area positioned at one end of the display area.

The OLED light emitting layer 20 is disposed in the display area of the array substrate 10. In an embodiment of the embodiment of the present disclosure, the OLED light emitting layer 20 may include an array of a plurality of organic electroluminescent structures each composed of an anode, a cathode, and a light emitting layer between the anode and the cathode. Electrons of the cathode and holes of the anode recombine in the OLED light emitting layer 20, this excites organic material of the OLED light emitting layer 20 to achieve luminescence.

The thin film encapsulation layer 30 is disposed on the array substrate 10, and the thin film encapsulation layer 30 is coated on an outer side of the OLED light emitting layer 20. The thin film encapsulation layer 30 includes a first inorganic encapsulation layer 31, a first organic encapsulation layer 32, and a second inorganic encapsulation layer 33 disposed in a stack. A material of the first inorganic encapsulation layer 31 includes one or a combination of two or more of silicon nitride, silicon dioxide, aluminum oxide, titanium dioxide, and zirconium dioxide. A material of the organic encapsulation layer 32 includes an olefin acid ester polymer, and a material of the second inorganic encapsulation layer 33 and a material of the first inorganic encapsulation layer 31 are same. A thickness of the second inorganic encapsulation layer 33 is same as a thickness of the first inorganic encapsulation layer 31.

The touch control layer 40 is disposed on a surface of the second inorganic encapsulation layer 33. The touch control layer 40 is provided with a touch control electrode formed by curing an electrically conductive netlike member. A number of the touch control electrodes can be determined according to actual needs, which is not specifically limited in the present disclosure.

The polarizing film layer 50 is disposed on the touch control layer 40. The polarizing film layer 50 is disposed to reduce ambient light reflected by the OLED display to reduce display contrast and visibility. As an embodiment of the polarizing film layer 50 of the present disclosure, the polarizing film layer 50 includes the adhesive layer 51, the photo alignment layer 52, and the protective layer 53.

The photo alignment layer 52 is disposed on the surface of the touch control layer 40. The main function of the photo alignment layer 52 is to convert natural light passing through the photo alignment layer 52 into linearly polarized light. In addition, the linearly polarized light is perpendicular to the previous linearly polarized light, such that the reflected light cannot be transmitted from the photo alignment layer 52, thereby reducing influence of ambient light and improving contrast. A material of the photo alignment layer 52 includes polyvinyl alcohol.

The adhesive layer 51 is disposed between the touch control layer 40 and the photo alignment layer 52, such that the touch control electrodes on the touch control layer 40 are bonded to the photo alignment layer 52. A size of the adhesive layer 51 is slightly less than a size of the photo alignment layer 52, that is, a projection of the adhesive layer 51 on the photo alignment layer 52 is completely within the photo alignment layer 52. In a first embodiment of the present solution, the adhesive layer 51 is preferably a pressure-sensitive optical adhesive.

The protective layer 53 is disposed on the surface of the photo alignment layer 52, and the protective layer includes an organic photoresist or silicon nitride. The protective layer 53 functions to protect the touch control layer 40 and the photo alignment layer 52 from contact with external moisture.

When forming the flexible touch control display module of the embodiment of the present discourse, an array substrate 10 is first provided. The array substrate 10 includes a display area and a non-display area positioned at one end of the display area.

Thereafter, an OLED light emitting layer 20 is deposited in the display area of the array substrate 10, and the thin film encapsulation layer 30 is deposited on the surface of the array substrate 10. The thin film encapsulation layer 30 completely covers the OLED light emitting layer 20. The thin film encapsulation layer 30 includes the first inorganic encapsulation layer 31, the first organic encapsulation layer 32, and the second inorganic encapsulation layer 33 disposed in a stack.

Then, a touch control sensing circuit is formed on the surface of the second inorganic encapsulation layer 33 to form the touch control layer 40. The touch control layer 40 includes a plurality of touch electrodes. The polarizing film layer 50 is disposed on the surface of the touch control layer 40. The polarizing film layer 50 includes the adhesive layer 51, the photo alignment layer 52, and the protective layer 53. The adhesive layer 51 is a pressure-sensitive optical adhesive. The adhesive layer 51 can bond the photo alignment layer 52 and the touch control layer 40. The protective layer 53 is disposed on the surface of the photo alignment layer 52 to protect the touch control layer 40 and the photo alignment layer 52 from external moisture and oxygen.

Finally, a protective cover 70 is bonded to the surface of the protective layer 53 using an optical adhesive 60 to obtain the flexible touch control display module according to the first embodiment of the present disclosure. The flexible touch control display module of the first embodiment of the present disclosure bonds the photo alignment layer 52 and the touch control layer 40 using the pressure-sensitive optical adhesive, and this does not need to be externally attached with a polarizer and an external touch screen, thereby greatly reducing a number of module fittings and an overall thickness of the touch control display module.

Figure 2:
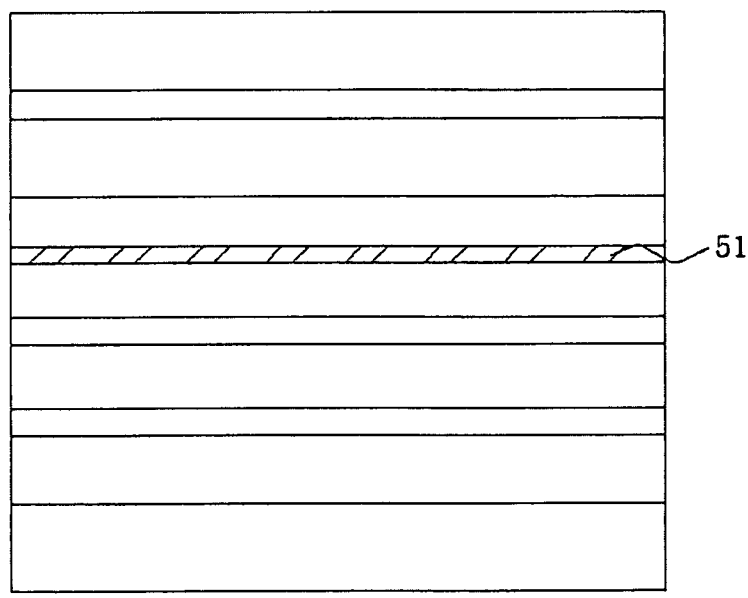
FIG. 2 is a schematic structural diagram of a flexible touch control display module according to a second embodiment of the present disclosure.

FIG. 2 is a schematic structural diagram of a flexible touch control display module according to a second embodiment of the present disclosure, which is different from the flexible touch control display module of the first embodiment of the present disclosure in that material of the adhesive layer 51 is different. The adhesive layer 51 is a photosensitive liquid substrate, preferably polyacrylic acid. The adhesive layer 51 presses the photo alignment layer 52 that completes stretch orientation with the touch control layer 40 on the AMOLED display screen. Further, curing the adhesive layer 51 is performed using ultraviolet light, and then the protective layer 53 is formed on the photo alignment layer 52. A material of the protective layer 53 includes organic photoresist or silicon nitride.

The solution avoids the pressure-sensitive optical adhesive bonding process of the first embodiment and can completely bond the photo alignment layer 52 and the touch control layer 40 on the AMOLED display screen to enhance product reliability.

The beneficial effects of the embodiment of the present disclosure are that, in the flexible touch control display module of the embodiment of the present disclosure, the touch control layer, the photo alignment layer, and the protective layer are formed on the thin film encapsulation layer of the touch control display module, thereby avoiding an externally attached polarizer and an external type touch screen, this further reduces a number of module fittings, and further reduces an overall thickness of the flexible touch control display module.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A flexible touch control display module, comprising:
an array substrate;
an organic light emitting diode (OLED) light emitting layer disposed on a surface of the array substrate;
a thin film encapsulation layer disposed on a surface of the OLED light emitting layer;
a touch control layer disposed on the thin film encapsulation layer; and
a polarizing film layer disposed on the touch control layer;
wherein the polarizing film layer comprises an adhesive layer, a photo alignment layer, and a protective layer, the photo alignment layer is disposed on the touch control layer, and the adhesive layer is disposed between the touch control layer and the photo alignment layer, such that the photo alignment layer is adhered to the touch control layer, and the protective layer is disposed on the photo alignment layer, and wherein the adhesive layer is a pressure-sensitive optical adhesive or a photosensitive liquid substrate;
wherein a material of the photosensitive liquid substrate comprises polyacrylic acid;
wherein the thin film encapsulation layer comprises a first inorganic encapsulation layer, a first organic encapsulation layer, and a second inorganic encapsulation layer disposed in a stack, a thickness of the second inorganic encapsulation layer is same as a thickness of the first inorganic encapsulation layer, a material of the photo alignment layer comprises polyvinyl alcohol, and the protective layer comprises an organic photoresist or silicon nitride.

2. The flexible touch control display module according to claim 1, wherein the touch control layer is provided with a touch control electrode formed by curing an electrically conductive netlike member.

3. The flexible touch control display module according to claim 1, wherein the touch control layer is disposed on a surface of the second inorganic encapsulation layer.

4. The flexible touch control display module according to claim 1, wherein a material of the first inorganic encapsulation layer comprises one or a combination of two or more of silicon nitride, silicon dioxide, aluminum oxide, titanium dioxide, and zirconium dioxide.

5. The flexible touch control display module according to claim 1, wherein a material of the organic encapsulation layer comprises an olefin acid ester polymer, and a material of the second inorganic encapsulation layer and a material of the first inorganic encapsulation layer are same.

6. A flexible touch control display module, comprising:
an array substrate;
an organic light emitting diode (OLED) light emitting layer disposed on a surface of the array substrate;
a thin film encapsulation layer disposed on a surface of the OLED light emitting layer;
a touch control layer disposed on the thin film encapsulation layer; and
a polarizing film layer disposed on the touch control layer;
wherein the polarizing film layer comprises an adhesive layer, a photo alignment layer, and a protective layer, the photo alignment layer is disposed on the touch control layer, and the adhesive layer is disposed between the touch control layer and the photo alignment layer, such that the photo alignment layer is adhered to the touch control layer, and the protective layer is disposed on the photo alignment layer;
wherein a material of the photosensitive liquid substrate comprises polyacrylic acid;
wherein the thin film encapsulation layer comprises a first inorganic encapsulation layer, a first organic encapsulation layer, and a second inorganic encapsulation layer disposed in a stack, a thickness of the second inorganic encapsulation layer is same as a thickness of the first inorganic encapsulation layer, a material of the photo alignment layer comprises polyvinyl alcohol, and the protective layer comprises an organic photoresist or silicon nitride.

7. The flexible touch control display module according to claim 6, wherein the touch control layer is disposed on a surface of the second inorganic encapsulation layer.

8. The flexible touch control display module according to claim 6, wherein a material of the first inorganic encapsulation layer comprises one or a combination of two or more of silicon nitride, silicon dioxide, aluminum oxide, titanium dioxide, and zirconium dioxide.

9. The flexible touch control display module according to claim 6, wherein a material of the organic encapsulation layer comprises an olefin acid ester polymer, and a material of the second inorganic encapsulation layer and a material of the first inorganic encapsulation layer are same.

* * * * *